United States Patent [19]
Keeney

[11] Patent Number: 5,798,966
[45] Date of Patent: Aug. 25, 1998

[54] FLASH MEMORY VDS COMPENSATION TECHIQUES TO REDUCE PROGRAMMING VARIABILITY

[75] Inventor: Stephen N. Keeney, San Jose, Calif.

[73] Assignee: Intel Corporation, Santa Clara, Calif.

[21] Appl. No.: 828,873

[22] Filed: Mar. 31, 1997

[51] Int. Cl.$^6$ ................................................. G11C 11/34
[52] U.S. Cl. ............................ 365/185.18; 365/185.26; 365/185.29; 365/185.33; 365/218
[58] Field of Search ..................... 365/185.18, 185.26, 365/185.29, 185.33, 218

[56] References Cited

U.S. PATENT DOCUMENTS

| | | | |
|---|---|---|---|
| 5,010,520 | 4/1991 | Minagawa et al. | 365/185.18 |
| 5,402,370 | 3/1995 | Fazio et al. | 365/185 |
| 5,420,370 | 5/1995 | Sloan, Jr. | 585/15 |
| 5,422,845 | 6/1995 | Ong | 365/185.18 |
| 5,440,505 | 8/1995 | Fazio et al. | 365/45 |
| 5,477,499 | 12/1995 | Van Buskirk et al. | 365/185.18 |
| 5,497,354 | 3/1996 | Sweha et al. | 365/230.06 |
| 5,539,690 | 7/1996 | Talreja et al. | 365/185.22 |
| 5,557,572 | 9/1996 | Sawada et al. | 365/185.29 |

FOREIGN PATENT DOCUMENTS

PCT/US95/ 06230 5/1995 WIPO ............... G11C 13/00

Primary Examiner—David C. Nelms
Assistant Examiner—Trong Phan
Attorney, Agent, or Firm—Blakely, Sokoloff, Taylor & Zafman

[57] ABSTRACT

A nonvolatile memory device. For one embodiment, the nonvolatile memory device includes a bit line, a source line, and a nonvolatile memory cell having a drain coupled to the bit line, a source coupled to the source line, a control gate, and a floating gate. The nonvolatile memory device also includes a source voltage generator circuit coupled to the source line and generating a source line voltage when programming the nonvolatile memory cell. The source voltage generator circuit varies the source line voltage based on a location of the nonvolatile memory cell in the memory array. The nonvolatile memory device may also include a drain voltage generator circuit coupled to the bit line and generating a bit line voltage when programming the nonvolatile memory cell. The drain voltage generator circuit varies the bit line voltage based on the location of the nonvolatile memory cell in the memory array.

20 Claims, 9 Drawing Sheets

FLASH MEMORY VDS COMPENSATION TECHIQUES TO REDUCE PROGRAMMING VARIABILITY

FIELD OF THE INVENTION

The present invention relates to the programming of memory cells. More particularly, the present invention relates to a method and circuitry for compensating source and drain voltages for programming flash memory cells in a memory device.

BACKGROUND

Nonvolatile memory devices such as Electrically programmable Read Only Memories ("EPROMs"), Electrically Erasable PROGRAMMABLE READ ONLY MEMORIES ("EEPROMs"), and flash EEPROMs include an array of nonvolatile memory cells and supporting circuitry for accessing the array. A nonvolatile memory cell typically behaves like a field effect transistor and includes a select or control gate that controls the reading and writing of data to the memory cell and a floating gate that traps charge corresponding to data stored by the memory cell.

An attractive feature of nonvolatile semiconductor memories is their ability to store analog data. This permits storage of multiple bits of data in a single memory cell. As charge is added to the floating gate of a memory cell, the threshold voltage Vt of the memory cell increases, and the memory cell drain current ID ("cell current") decreases. The memory cell threshold voltage Vt is related to the memory cell drain current ID such that ID is proportional to:

$$Gm \times (VG-Vt) \text{ for } VD > VG-Vt \quad \text{(Equation 1)}$$

where Gm is the transconductance of the memory cell; VG is the memory cell gate voltage; VD is the memory cell drain voltage; and Vt is the memory cell threshold voltage.

For memory cells storing multiple bits of data, each of the possible patterns of bits represents one state. In effect, the cell is storing base S data, where S is the number of states the cell is capable of storing. The bit pattern results from decoding the state data of one or multiple cells. For example, for memory cells storing two bits of data there are four bit patterns: 00, 01, 10, and 11. Each of these bit patterns is represented by a state. The particular state represented by a particular pattern of bits depends upon the type of coding used (e.g., Gray coding or binary). The type of coding generally does not effect the method of programming.

States may be defined in a variety of ways. They may be defined in terms of a range of threshold voltages Vt, a range of drain currents ID, or a range of charge.

FIG. 1 illustrates a conventional section of a flash memory array 100 including flash memory cells 112, 114, 116, and 118 formed at the intersections of word lines 138 and 140 and bit lines 146 and 148. Each flash memory cell includes a select gate and a floating gate. For example, flash memory cell 112 includes control gate 144 and floating gate 142. Flash memory cells 112 and 114 have their control gates coupled to word line 138, and flash memory cells 116 and 118 have their control gates coupled to word line 140. Flash memory cells 112 and 116 have one terminal or electrode coupled to bit line 146 and another terminal or electrode coupled to a common source line 150 that is coupled to source voltage VPS. Similarly, flash memory cells 114 and 118 have one terminal or electrode coupled to bit line 148 and another terminal or electrode coupled to a common source line 150.

Word lines 138 and 140 are also referred to as X lines or row lines because each word line is coupled to an X decoder circuit that provides the necessary voltages on word lines 138 and 140 to read, erase, or program data into flash memory cells 112, 114, 116, and 118. Similarly, bit lines 146 and 148 are also referred to as Y line or column lines because each bit line is coupled to a Y decoder circuit and voltage generation circuitry that provides the necessary voltage VPP on bit lines 146 and 148 to read, erase, or program data into flash memory cells 112, 114, 116, and 118.

Together the bit lines, word lines, and common source line provide a means of applying to the memory cells the voltages necessary for programming, erasing, and reading memory cells within array 100. Memory cells 112, 114, 116, and 118 may be erased using Fowler-Nordheim tunneling by applying approximately zero volts on word lines 138 and 140, allowing bit lines 146 and 148 to float, and setting VPS to approximately 12 volts on common source line 150. In this configuration, the entire array of memory cells may be erased at once. Alternatively, the entire array of memory cells may be erased using negative gate erasure, that is, setting VPS to approximately 5-6 volts and applying approximately -8 to -10 volts on word lines 146 and 148. Memory cells 112, 114, 116, and 118 may be read by applying approximately one to seven volts on word lines 138 and 140, applying approximately one volt to VPP on bit lines 146 and 148, and allowing common source line 150 to be grounded.

Memory cells 112, 114, 116, and 118 may be programmed via hot electron injection by applying VPP on bit line 146 or 148 that is approximately 4-7 volts above VPS and applying a voltage to word line 138 or 140, respectively, that is sufficient to change the amount of charge stored and the threshold voltage of the memory cells being programmed. Typically one or more flash memory cells in a row of cells are programmed at one time while the other rows of memory cells are deselected.

Generally, the programming time of a flash memory cell varies inversely with respect to the difference between the drain and source programming voltages applied to the memory cell during programming. FIG. 2 illustrates the relationship of the threshold voltage Vt of a flash memory cell during programming with respect to the programming time and the programming drain voltage VD applied to the memory cell when the source programming voltage VS is approximately zero volts.

In FIG. 2, curve 223 is an illustration of the relationship between the threshold voltage and the programming time of a flash memory cell when the drain programming voltage VD is approximately 6 volts and the source programming voltage VS is approximately zero volts. Curve 224 illustrates the relationship between the threshold voltage and the programming time of a flash memory cell when the programming drain voltage is approximately 5 volts and the source programming voltage VS is approximately zero volts. As illustrated in FIG. 2, if the difference between the programming drain voltage and the source programming voltage is relatively higher, the programming time for the flash memory cell to reach the same threshold voltage will accordingly be shorter.

FIG. 1 shows that bit lines 146 and 148 and source line 150 each have systematic resistance due to inherent electrical and physical properties of the materials used to construct the bit lines (e.g., various types of metals, or doped silicon or polysilicon). For example, bit line 146 has resistance 120 and 122, bit line 148 has resistance 124 and 126, and common source line 150 has resistance 128, 130, 132, 134, and 136. The values of the bit line resistance and the source line resistance are a function of the location of the flash memory cells within memory array 100 and are therefore systematic. The resistance of a physical line depends upon the geometry of the line and may be generally represented by the equation:

$$R = p \times (L/A) \qquad \text{(Equation 2)}$$

where R is the resistance of the line; p is the resistivity of the material from which the line is fabricated; L is the length of the line; and A is the cross sectional area of the line. As indicated by equation 2, the resistance of a line generally increases as the length of the line increases. Thus, the further away a flash memory terminal is located from a voltage source (i.e., VPS or VPP), the greater the amount of resistance, and the greater the deviation from the voltage supplied by the voltage source.

For example, if VPS is set to zero volts during programming of flash memory cell 116, then the zero volts would increase across each of resistance 136, 134, and 130. The voltage that may actually appear as the source programming voltage VS at the source of memory cell 116 would then be a voltage greater than zero volts. Similarly, a programming voltage VPP may start out as 6 volts at the top of bit line 146, but will experience voltage drops across each of resistance 120 and 122 such that the drain programming voltage VD will be less than 6 volts. Thus, relative to the programming differential voltage of VPP-VPS, the actual programming differential voltage VD-VS may be significantly smaller such that the time required to program memory cell 116 to a predetermined state will increase. Thus, it generally requires a longer period of time to program flash memory cells that are further away from program voltages sources VPP and VSS than to program flash memory cells that are closer to program voltage sources VPP and VSS.

The bit line resistance and source line resistance may also cause memory cells designated to be programmed to the same state to be programmed to different states for a given programming time. For example, memory cell 118 located close to voltage sources VPP and VPS may see VD and VS voltages that are close to VPP and VPS and be programmed to a particular state in a given programming time. In contrast, memory cell 116 located further away from voltage sources VPP and VPS may see VD and VS voltages that are significantly far away from VPP and VPS such that memory cell 116 is programmed to a different state in the same programming time. Thus, there exists a degree of programming variability due to the location of the flash memory cells within flash memory array 100.

The systemic source line resistance also causes the source programming voltage VS to vary with respect to the number of flash memory cells simultaneously programmed at any given time. As the source terminal of every flash memory cell in a given block of flash memory is connected to common source line 150, the current flowing through common source line 150 will vary depending upon the number of flash memory cells that are programmed at one time. As the current varies in common source line 150, the voltages coupled to each of the sources of the flash memory cells will also vary. Generally, VS increases when more cells are programmed at one time. Thus, the source programming voltage VS coupled to each flash memory cell is also dependent upon the data pattern supplied to the flash memory device.

Some techniques have been developed to counteract the negative affects of bit line resistance or source line resistance. One technique decreases the source line resistance by using low resistance metal lines as source straps within a flash memory array. This technique still results in different source voltages being applied to flash memory cells based on the location of the selected memory cell relative to the source straps.

Another technique disclosed in U.S. Pat. No. 5,402,370 adjusts the drain programming voltage source applied to the top of a bit line on a device-by-device basis to compensate for changes in the programming ability of flash memory cells due to device-to-device variations in the channel length of memory cells. This technique does not change the programming voltage source to compensate for bit line resistance or source line resistance.

Yet another technique compensates for bit line resistance by providing one drain programming voltage to the top half of a block of flash memory cells, and another drain programming voltage to the bottom half of the block of flash memory cells. This technique does not compensate for the source line resistance or data pattern dependency.

SUMMARY OF THE INVENTION

A nonvolatile memory device and method of setting programming voltages is described. For one embodiment, the nonvolatile memory device includes a bit line, a source line, and a nonvolatile memory cell having a drain coupled to the bit line, a source coupled to the source line, a control gate, and a floating gate. The nonvolatile memory device also includes a source voltage generation circuit coupled to the source line and generating a source line voltage when programming the nonvolatile memory cell. The source voltage generation circuit varies the source line voltage based on a location of the nonvolatile memory cell in the memory array. The nonvolatile memory device may also include a drain voltage generation circuit coupled to the bit line and generating a bit line voltage when programming the nonvolatile memory cell. The drain voltage generation circuit varies the bit line voltage based on the location of the nonvolatile memory cell in the memory array.

Other features and advantages of the present invention will be apparent from the accompanying drawings and from the detailed description that follows.

BRIEF DESCRIPTION OF THE DRAWINGS

The features and advantages of the present invention are illustrated by way of example and not limitation in the figures of the accompanying drawings in which like references indicate similar elements and in which.

DETAILED DESCRIPTION

A method and apparatus for setting source and drain programming voltages of a flash memory cell is described. The embodiments described below are for adjusting the bit line or source line voltage to compensate for the systematic bit line resistance and source line resistance present in a flash memory array such that a substantially uniform drain-to-source programming voltage difference for each flash memory cell is maintained throughout the memory array. The goal of compensating for bit line resistance and source line resistance is to help increase the speed of programming a flash memory cell, help to reduce programming variability that may cause memory cells of different locations to otherwise program to different values, and to help to reduce program variability caused by programming more than one flash memory cell at one time.

Figure 1:
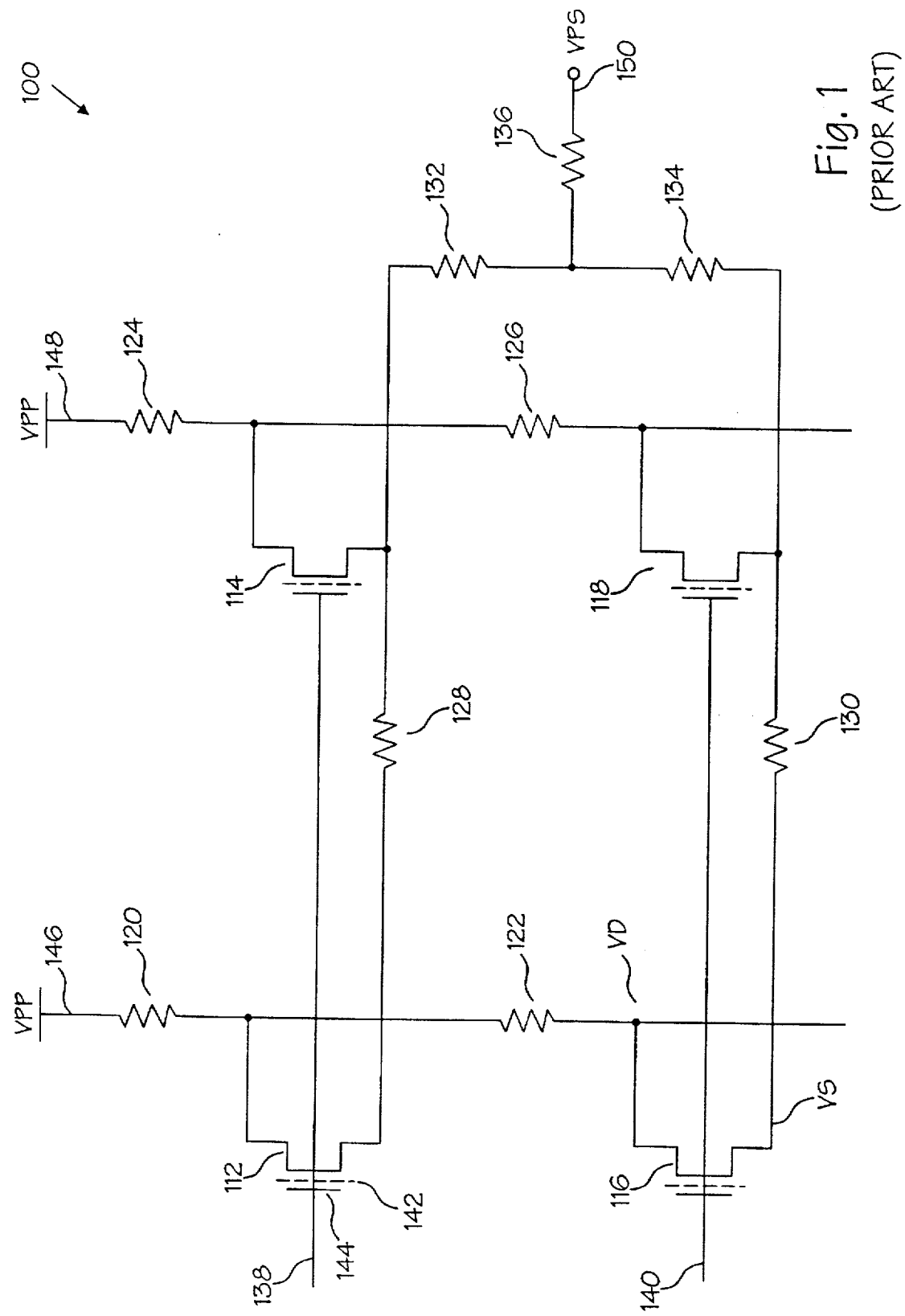
FIG. 1 is a prior art flash memory array including bit line resistance and source line resistance.
Figure 2:
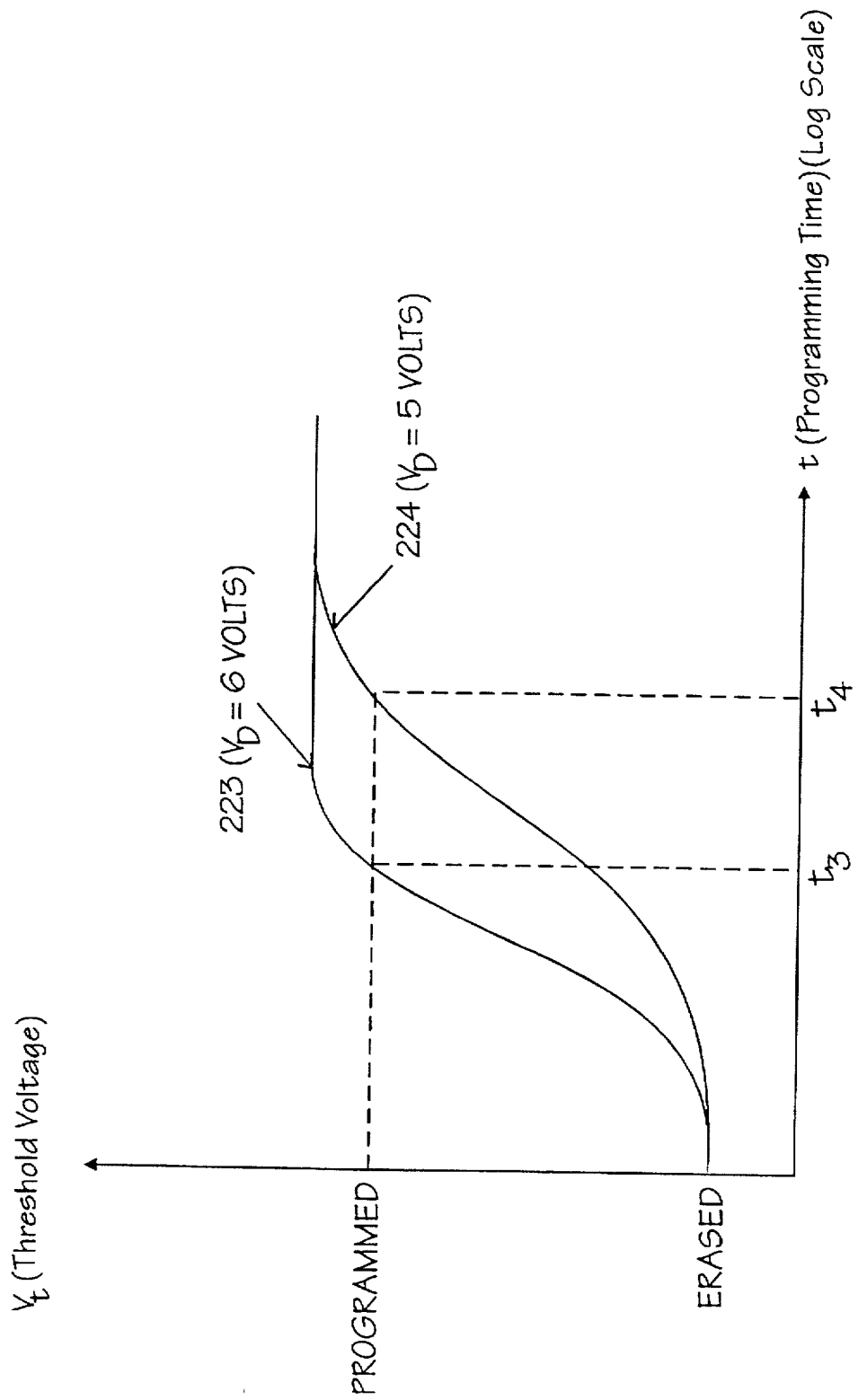
FIG. 2 is a voltage-time diagram illustrating the threshold voltage of a flash memory cell with respect to programming time and varying drain programming voltages with a fixed source programming voltage.

As will be described in more detail below, one embodiment of the present invention includes a nonvolatile memory device that has a nonvolatile memory array, a control circuit, a source voltage generator, and a drain voltage generator. The memory array includes flash memory cells arranged as illustrated in FIG. 1 having bit line resistance and source line resistance between a drain voltage generator and a source voltage generator. The control circuit receives an address of a flash memory cell in the array to be programmed. The control circuit decodes the address and indicates the address of the flash memory cell to the source voltage generator circuit and the drain voltage generator. Based on the address of the selected flash memory cell, the source voltage generator generates a source line voltage that compensates for the source line resistance between the source voltage generator and the source of the selected flash memory cell. Similarly, based on the address of the selected flash memory cell, the drain voltage generator generates a bit line voltage that compensates for the bit line resistance between the drain voltage generator and the selected flash memory cell. Thus, a substantially constant drain-to-source (VDS) programming voltage difference may be applied to a selected memory cell regardless of the location of the memory cell in the flash memory array resulting in substantially uniform programming speed and reduced programming variability.

Figure 3:
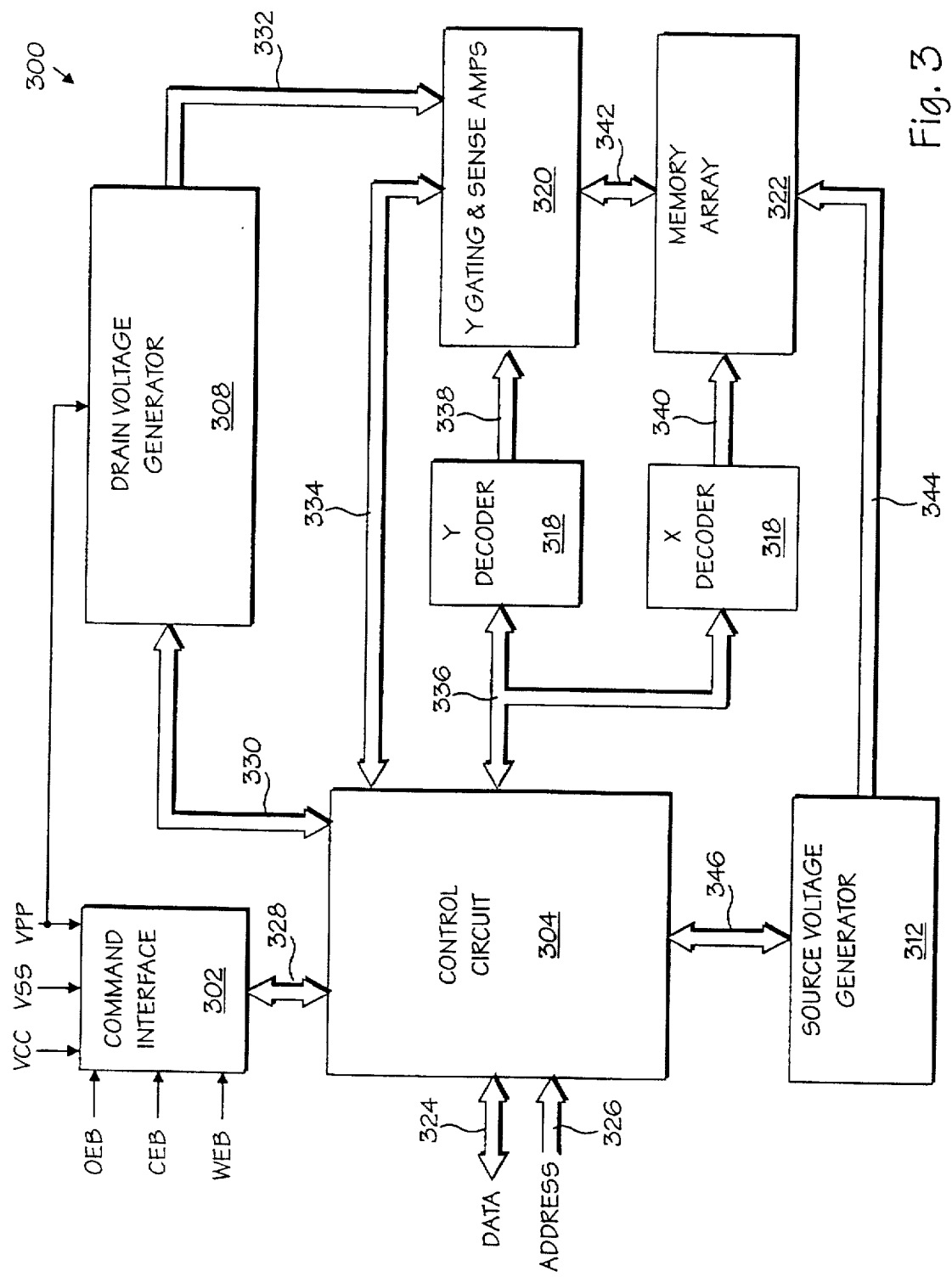
FIG. 3 is a block diagram of a flash memory device including a drain voltage generation circuit and a source voltage generation circuit.

FIG. 3 shows nonvolatile memory device 300 in which embodiments of the present invention may be practiced. The embodiments described below may also be practiced in volatile memory arrays including DRAM arrays including memory cells that may store multiple states of information.

Memory device 300 includes command interface 302, control circuit 304, drain voltage generator 308, source voltage generator 312, Y decoder 316, X decoder 318, Y gating and sense amplifiers 320, and memory array 322. For one embodiment, all of the circuitry of flash memory device 300 resides on a single substrate.

Memory array 322 includes nonvolatile memory cells arranged in rows and columns as illustrated in FIG. 1. The nonvolatile memory cells store data at addresses. The threshold voltages of the nonvolatile memory cells can be altered during programming, thus permitting storage of analog voltage levels. For one embodiment, each of the memory cells in memory array 322 stores a single bit of data at one time. For another embodiment, each of the memory cells in memory array 322 stores multiple bits of data at one time. The memory cells in memory array 322 may be programmed, erased, or read as generally described above except that the programming voltages applied to the source and drain terminals of a selected memory cell are generated as described herein.

Memory array 322 may have one memory array, or it may have blocks of memory cells. Each block of memory cells may be addressed independently. For example, one of the address signal lines may indicate the block of the memory that a selected flash memory cell is in, and the balance of the address signal lines may indicate the location of the selected memory cell within the selected block of memory.

For one embodiment of memory device 300, control circuit 304 controls programming of one or more selected memory cells in memory array 322. For one embodiment, control circuit 304 includes a processor controlled by microcode. For another embodiment, control circuit 304 is a state machine or logic circuits that implement the various functions for programming memory cells in memory array 322.

Control circuit 304 manages memory array 322 via control of X decoder 318, Y decoder 316, Y gating and sense amplifiers 320, drain voltage generator 308, and source voltage generator 312. Control circuit 304 may include an address latch for latching the addresses applied from external circuitry to address bus 326 and to be supplied to Y decoder 316 and X decoder 318 via bus 336. Control circuit 304 may also include data buffers coupled to Y gating and sense amplifiers 320 via bus 334. Y gating and sense amplifiers 320 and may buffer the data read from memory array 322 or the data to be programmed into memory array 322.

User commands for reading, erasing, and programming are communicated to control circuit 304 via command interface 302. An external user issues commands to command interface 302 via control signals including output enable OEB, chip select CEB, and write enable WEB. Other control signals may be used. Command interface 302 receives power supply voltage VCC, ground VSS, and programming/erase voltage VPP. VCC and VSS may be coupled to every circuit in flash memory device 300. For one embodiment, VCC is approximately 3–6 volts. VPP may be generated internally or be provided externally from flash memory device 300. During programming of a selected flash memory cell in memory array 322, VPP may range from approximately 5–13 volts.

Flash memory device 300 may be coupled to a microprocessor or any other type of controller device or logic (programmable or otherwise) that may generate control, address, and/or data signals for flash memory device 300. Flash memory device 300 may be used in any kind of computer or data processing system. A computer system within which flash memory device 300 may be used may be a personal computer, a notebook computer, a laptop computer, a personal assistant/communicator, a minicomputer, a workstation, a mainframe, a multiprocessor computer, or any other type of computer system. In addition, a system in which flash memory device 300 is used may be a printer system, a cellular phone system, a digital answering system, a digital camera, or any other data storage system.

A memory cell to be programmed in memory array 322 is selected in response to an address supplied on bus 326 to control circuit 304. Control circuit 304 communicates the address of the selected flash memory cell to Y decoder 316 and X decoder 318 via bus 336. A data pattern to be programmed into the one or more of the selected memory cells may be provided on data bus 324 and supplied to Y gating and sense amplifiers 320 by control circuit 304 via bus 334.

Data read from memory array 322 is coupled to Y gating and sense amplifiers 320 via bus 342 and passed to data bus 324 by control circuit 304. Alternatively the data read from memory array 322 may be output to data bus 324 by circuitry under the control of control circuit 304 without passing through control circuit 304. Y gating and sense amplifiers 320 may determine the state of data presented to it using a reference cell array (not shown) or by other means. One example of circuitry that may be used to determine the state of data read from memory array 62 is disclosed in published PCT application PCT/US95/06230 having international publication number WO 95/23074 published on Dec. 14, 1995, and entitled SENSING SCHEMES FOR FLASH MEMORY WITH MULTILEVEL CELLS. Another example of circuitry that may be used to determine the state of data read from memory array 62 is disclosed in U.S. Pat. No. 5,539,690 entitled WRITE VERIFY SCHEMES FOR FLASH MEMORY WITH MULTILEVEL CELLS. Yet another example of circuitry that may be used to determine the state of data read from memory array 62 is disclosed in U.S. Pat. No. 5,497,354 entitled BIT MAP ADDRESSING SCHEMES FOR FLASH MEMORY.

Flash memory device 300 also includes drain voltage generator 308 coupled to control circuit 304 via bus 330. Based on the location of one or more selected memory cells in memory array 322, drain voltage generator 308 generates one or more bit line voltages that have been adjusted to compensate for bit line resistance associated with the selected memory cells. Drain voltage generator 308 may also receive programming voltage VPP.

Similarly, flash memory device 300 includes source voltage generator 312 coupled to control circuit 304 via bus 346. Based on the location of the selected memory cells in memory array 322, source voltage generator 312 generates a source line voltage that has been adjusted to compensate for source line resistance associated with the selected memory cells. Source voltage generator 312 may also receive programming voltage VPP.

For another embodiment, only drain voltage generator 308 is required in flash memory device 300. For this embodiment, drain voltage generator 308 adjusts the bit line voltage coupled to the bit line of a selected memory cell to compensate for bit line resistance of the bit line and for source line resistance of a source line coupled to the selected memory cell. Drain voltage generator 308 may also adjust the bit line voltage to compensate for data pattern dependency, that is, the change in the source voltage at the source terminal of a selected memory cell due to the programming of more than one selected memory cell at one time.

For yet another embodiment, only source voltage generator 312 is required in flash memory device 300. For this embodiment, source voltage generator 312 adjusts the source line voltage coupled to the common source line of selected memory cells to compensate for source line resistance of the common source line and for bit line resistance of the bit line coupled to the selected memory cell. Source voltage generator 312 may also adjust the source line voltage to compensate for data pattern dependency, that is, the change in the source voltage at the source terminal of a selected memory cell due to the programming of more than one selected memory cell at one time.

In operation, control circuit 304 receives the address of a selected memory cell to be programmed and passes the address to the drain voltage generator 308 via bus 330 and to source voltage generator 312 via bus 346. For one embodiment, busses 330 and 346 may be the same bus. For another embodiment, busses 330 and 346 may be bus 336.

After the receipt of the address of the selected memory cell, drain voltage generator 308 generates the appropriate bit line voltage for the selected memory cell. Drain voltage generator 308 may be a state machine, control logic, or other type of intelligent circuitry that can accurately calculate and generate an adjusted bit line voltage to compensate for bit line resistance associated with the bit line coupled to the selected memory cell. Drain voltage generator 308 may also include addressable memory that stores values representing bit line voltages corresponding to the location of the selected memory cell.

Generally, without compensation, the nominal bit line voltage generated by drain voltage generator 308 is approximately 4–7 volts when programming a selected memory cell. If the selected memory cell is located near drain voltage generator 308 (i.e., near the top of memory array 322), then drain voltage generator 308 may generate a bit line voltage that adds only a small amount (e.g., 10–150 millivolts) to the nominal bit line voltage during programming. If the selected memory cell is located further away from drain voltage generator 308 (i.e., near the bottom of memory array 322), then drain voltage generator 308 may generate a bit line voltage that adds a larger amount (e.g., 200 millivolts to 2 volts) to the nominal bit line voltage during programming.

Similarly, after the receipt of the address of the selected memory cell, source voltage generator 312 generates the appropriate source line voltage for the selected memory cell. Source voltage generator 312 may be a state machine, control logic, or other type of intelligent circuitry that can accurately calculate and generate an adjusted source line voltage to compensate for source line resistance associated with the source line coupled to the selected memory cell. Source voltage generator 312 may also include addressable memory that stores values representing source line voltages based on the location of the selected memory cell.

Generally, without compensation, the nominal source line voltage generated by source voltage generator 312 is approximately zero volts when programming a selected memory cell. For one embodiment, source voltage generator 312 may generate a larger positive source line voltage (e.g., 10 millivolts to 2 volts) when the selected memory cell is located closer to source voltage generator 312 or source voltage straps than when the selected memory cell is located further away from source voltage generator 312 or from source straps.

For another embodiment, without compensation, the nominal source line voltage generated by source voltage generator 312 is a negative voltage when programming a selected memory cell. For this embodiment, source voltage generator 312 may generate either a less negative voltage, approximately zero volts, or a positive voltage when the selected memory cell is located further from source voltage generator 312 or source voltage straps than when the selected memory cell is located closer to source voltage generator 312 or to source straps. For one embodiment, the selected memory cell may be fabricated in its own well that may be negatively biased.

As generally known in the art, the bit line resistance and source line resistance may be calculated (e.g., using equation 2 above) or simulated prior to manufacture of flash memory device 300 given the materials used to fabricate the bit lines and source lines, the geometries of the bit lines and source lines, and the effects of other circuit components coupled to the bit lines and source lines.

Additionally, source voltage generator 312 may receive a data pattern supplied to the control circuit 304 from bus 324. The data pattern may be supplied to source voltage generator 312 via bus 346 or via another bus (not shown). As previously described, the data pattern may indicate that more than one memory cell may be selected to be programmed at one time causing the source programming voltage at the terminals of the selected memory cells to further deviate because of the source resistance of the common source line. Source voltage generator 312 may further adjust the source line voltage to compensate for this further deviation such that the source programming voltage received at the source terminal of each selected memory cell may be within an acceptable range to cause the appropriate state to be programmed into each selected memory cell within a given programming time. As with the bit line resistance and source line resistance, the effect of programming multiple memory cells at once can be calculated or simulated prior to the manufacture of memory device 300.

Figure 4:
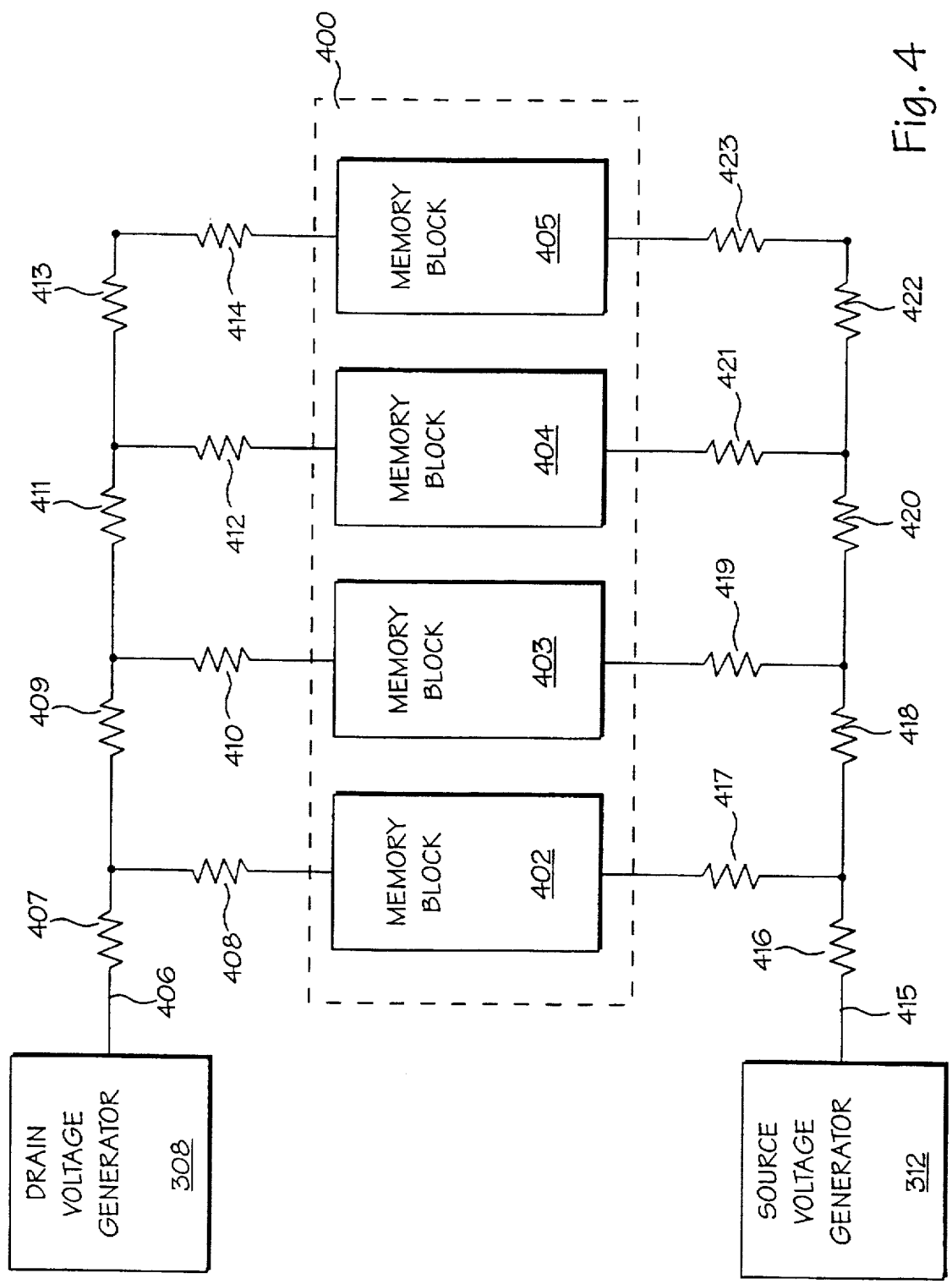
FIG. 4 is a block diagram of one embodiment of the flash memory segmented into memory blocks.

If memory array 322 has separately addressable blocks of flash memory, there may exist further bit line resistance and source line resistance between the drain voltage generator and the memory blocks, and the source voltage generator and the memory blocks. FIG. 4 illustrates memory array 400 which is one embodiment of memory array 322 having four separately addressable memory blocks 402–405. As illustrated in FIG. 4, there are a number of bit line resistance 407–414 that exist for a given bit line 406, and a number of source line resistance 416–423 that exist for source line 415. Drain voltage generator 308 may also adjust the bit line voltage applied to bit line 406 to compensate for the bit line resistance that exists between drain voltage generator 308 and the selected memory block that includes a selected memory cell. Similarly, source voltage generator 312 may also adjust the source line voltage applied to source line 424 to compensate for the source line resistance that exists between source voltage generator 312 and the selected memory block that includes a selected memory cell.

Once drain voltage generator 308 and source voltage generator 312 have determined the appropriate bit line and source line voltages to apply to the bit line and source line, respectively, of a selected memory cell, then the selected memory cell may be programmed using various known programming methods. For one embodiment, one memory cell is programmed at a time. For another embodiment, more than one selected memory cell is programmed at one time. One programming method that may be used is disclosed in U.S. Pat. No. 5,440,505 entitled METHOD AND CIRCUITRY FOR STORING DISCRETE AMOUNTS OF CHARGE IN A SINGLE MEMORY ELEMENT.

By adjusting the bit line voltage to compensate for voltage drops on a bit line due to bit line resistance, and adjusting the source line voltage to compensate for voltage increases on a source line due to source line resistance, the actual drain-to-source (VDS) voltage across the terminals of each selected memory cell in memory array 322 may be controlled to be substantially constant or uniform throughout the memory array. This may significantly reduce or eliminate, loss of programming speed due to the location of the selected memory cell in the memory array. This may also reduce or eliminate the programming variability based on the location of selected memory cells or based on data dependency.

Figure 5:
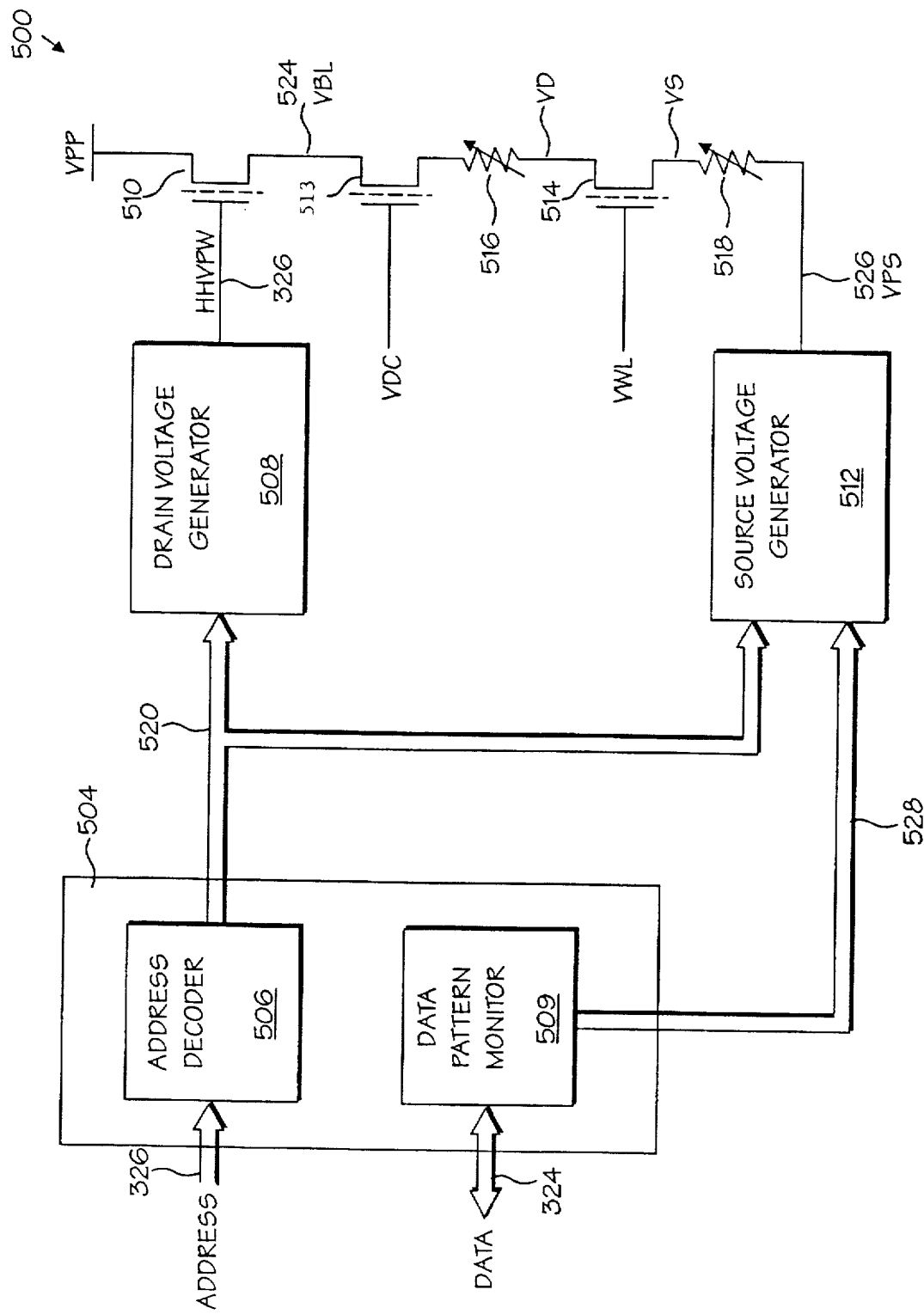
FIG. 5 is a block diagram of one embodiment of the flash memory device of FIG. 3 including an address decoder, a data pattern monitor, a drain voltage generation circuit, a source voltage generation circuit, a flash memory cell, a bit line resistance, and a source line resistance.

FIG. 5 shows memory device 500 that is one embodiment of particular features from memory device 300 that cooperate to program selected flash memory cell 514. Selected memory cell 514 is a memory cell in flash memory array 322 of FIG. 3. Memory device 500 includes control circuit 504, drain voltage generator 508, and source voltage generator 512 which operate in a similar manner as control circuit 304, drain voltage generator 308, source voltage generator 312, respectively, of FIG. 3.

Control circuit 504 includes address decoder 506 and data pattern monitor 509. Address decoder 506 decodes an address for selected memory cell 514 and provides the decoded address to drain voltage generator 508 and source voltage generator 512 via bus 520. The decoded address output by address decoder 506 may indicate the memory block in which selected memory cell 514 is located, the row location of selected memory cell 514, and/or the column location of selected memory cell 514.

In response to the decoded address received from address decoder 506, drain voltage generator 508 generates HHVPW on line 522. HHVPW is coupled to the gate of n-channel MOSFET transistor 510. Transistor 510 is coupled in series with decode n-channel MOSFET transistor 513 and selected flash memory cell 514. The drain of transistor 510 is coupled to program/erase voltage VPP, and the source of transistor 510 is coupled to the drain of decode transistor 513. For one embodiment, VPP is approximately 9 volts. HHVPW is a programming voltage that is generated by drain voltage generator 508 such that a bit line voltage VBL is generated on bit line 524. VBL is approximately one threshold voltage lower than HHVPW. For one embodiment, the threshold voltage of transistor 510 may be approximately 2–4 volts. For other embodiments, the threshold voltage of transistor 510 may be approximately 0.5–2 volts.

Drain voltage generator 508 will change the value of HHVPW based on the location of selected memory cell 514 so as to compensate for bit line resistance 516. For another embodiment, HHPVW also compensates for source line resistance 518.

Decode transistor 513 is an optional transistor that receives gate voltage VDC from Y gating and sensing amplifiers 320 of FIG. 3. The drain of transistor 513 is coupled to the source of transistor 510, and the source of decode transistor 513 is coupled to the drain of selected memory cell 514. When VDC is low, VBL is not coupled to the drain of selected memory cell 514. When VDC is high, decode transistor 513 couples VBL to the drain of selected memory cell 514. VBL will drop across bit line resistance 516 and will result in a drain programming voltage VD at the drain terminal of selected memory cell 514. The value of bit line resistance 516 is a function of the location of selected memory cell within memory array 322 and, as previously described, can be calculated or simulated. For another embodiment, decode transistor 513 may change positions with transistor 510. For yet another embodiment, decode transistor 513 is not required.

Source voltage generator 512 also receives the decoded address of selected memory cell 514 from control circuit 504 via bus 520. In response to the decoded address, source voltage generator 512 generates a source line voltage VPS on line 526. Source line voltage 526 compensates for source line resistance 518 such that a source programming voltage VS is coupled to the source terminal of selected memory cell 514. The value of source line resistance 518 varies as a function of the location of selected memory cell 514 within memory array 322. Selected memory cell 514 further includes a gate terminal that receives word line voltage VWL that may be provided by X decoder 318.

Control circuit 504 also includes data pattern monitor 509 that interprets the data pattern on data bus 326. From a given data pattern, data pattern monitor 509 may determine the number of selected memory cells to be programmed at one time. For one embodiment, data pattern monitor 509 is a counter that counts the number of high or low bits in the data pattern on bus 326.

Data pattern monitor 509 passes an indication of the number of selected memory cells to be programmed at one time to source voltage generator 512 via bus 528. As previously described, given that each selected memory cell in a block of memory has its source terminal coupled to a common source line, programming more than one selected memory cell at one time increases the variability of source programming voltage VS received by each memory cell. Therefore, source voltage generator 512 may monitor the number of selected memory cells programmed at one time in addition to monitoring the location of each selected memory cell and generate a source line voltage VPS accordingly.

Generally, the source programming voltage VS will increase when the number of selected memory cells programmed at the same time increases. Therefore, when the number of selected memory cells being programmed increases, source voltage generator 512 decreases source line voltage VPS to compensate or offset the increase in VS.

With HHVPW and bit line voltage VBL compensating for bit line resistance 516, and source line voltage VPS compensating for source line resistance 518, the drain-to-source voltage VDS across selected memory cell 514 may be maintained such that the time required to program selected memory cell 514 is not increased due to bit line resistance 516 and source line resistance 518. Additionally, the affects of data dependency may be negated.

For one embodiment, only drain voltage generator 508 is required and data pattern monitor 509 passes the number of selected memory cells to be programmed to drain voltage generator 508. HHPVW and bit line voltage VBL may then be adjusted in response to both the address of the selected memory cells and the number of selected memory cells to be programmed at one time.

For another embodiment, the address of selected memory cell 514 may be coupled directly to drain voltage generator 508 and source voltage generator 512 without being decoded by address decoder 506. For yet another embodiment, each of drain voltage generator 508 and source voltage generator 512 may include an address decoder and/or a data pattern monitor.

Figure 6:
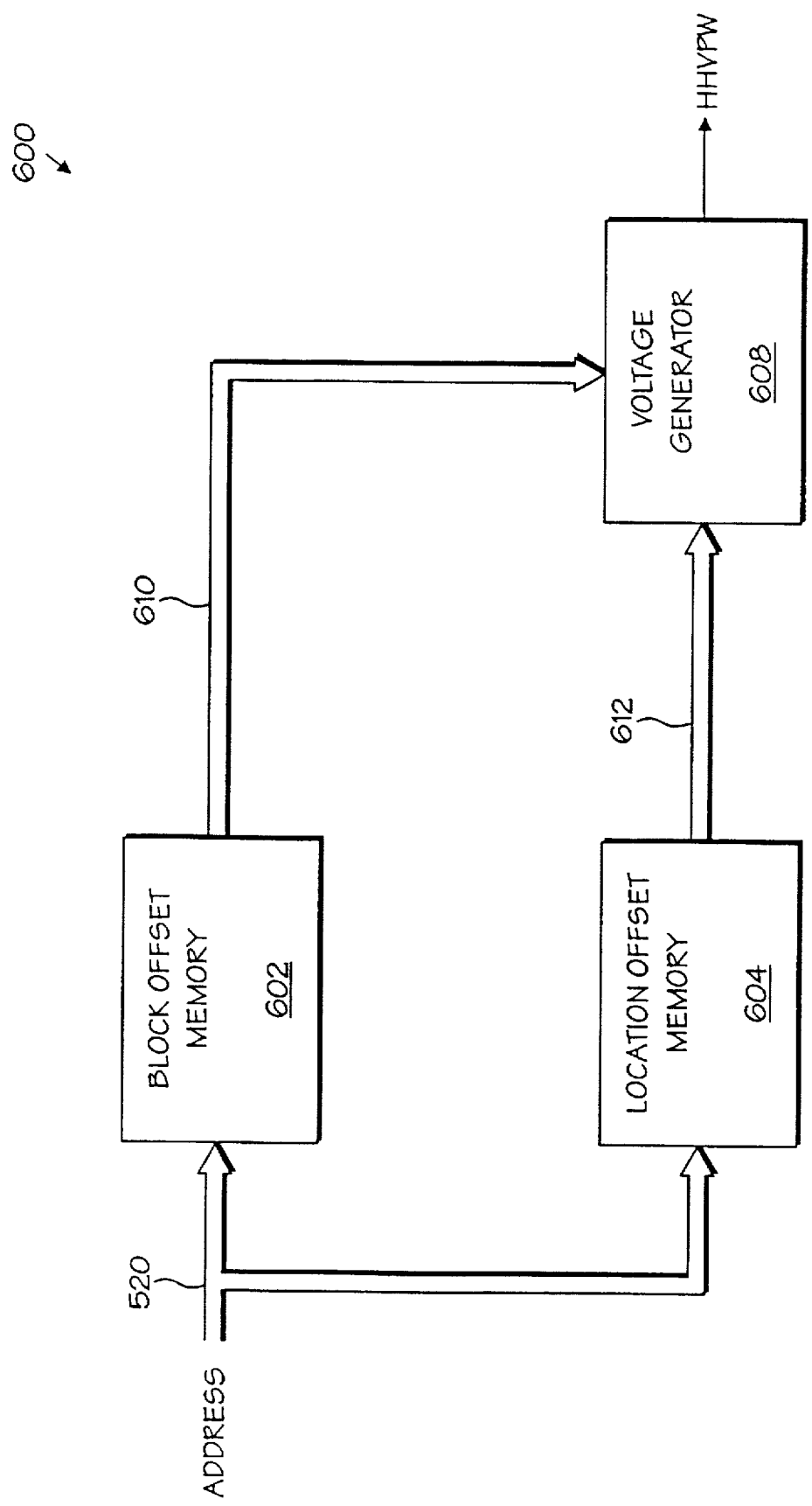
FIG. 6 is a block diagram of one embodiment of the drain voltage generator of FIG. 3.

FIG. 6 shows drain voltage generator 600 that is one embodiment of drain voltage generator 508 of FIG. 5. Drain voltage generator 600 includes block offset memory 602 and location offset memory 604 each receiving an address of a selected memory cell to be programmed via bus 520. Each of block offset memory 602 and location offset memory 604 may be nonvolatile memory such as flash memory cells, EPROM cells, ROM cells, or EEPROM cells, or other types of memory including volatile memory.

Block offset memory 602 decodes the block address for the selected memory cell and stores values indicating a first offset voltage from a nominal programming voltage (e.g., 6 volts) to compensate for the bit line resistance that exists between blocks of memory. Block offset memory 602 supplies a value indicative of the first offset voltage to voltage generator 608 via bus 610. For one embodiment, block offset memory 602 stores the values indicating the first offset voltages at addresses that are accessed by the address supplied on bus 520. For another embodiment, block offset memory 602 stores a program that calculates the first offset voltage in response to the address received on bus 520.

Location offset memory 604 decodes the address for the selected memory cell within the selected block of memory and stores values indicating a second offset voltage from the nominal programming voltage. Location offset memory 604 supplies a value indicative of the second offset voltage to voltage generator 608 via bus 612. The second offset voltage compensates for the bit line resistance that exists for the selected memory cell coupled to a particular bit line (e.g., bit line resistance 516). For one embodiment, location offset memory 604 stores the values indicating the second offset voltages at addresses that are accessed by the address supplied on bus 520. For another embodiment, location offset memory 604 stores a program that calculates the second offset voltage in response to the address received on bus 520.

Voltage generator 608 receives the values from block offset memory 602 and location offset memory 604 and generates HHVPW.

Figure 7:
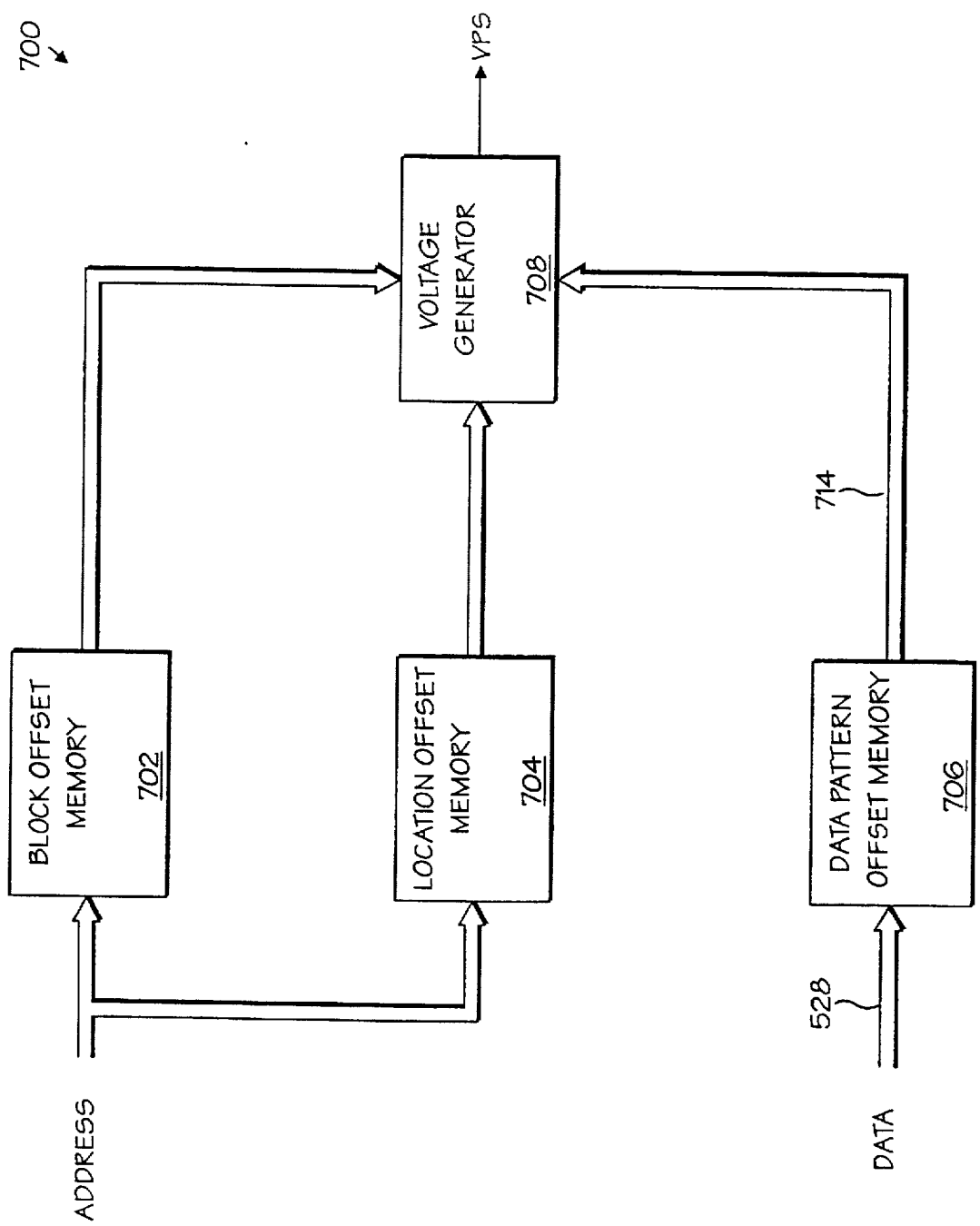
FIG. 7 is a block diagram of one embodiment of the source voltage generator of FIG. 3.

FIG. 7 shows source voltage generator 700 that is one embodiment of source voltage generator 512 of FIG. 5. Source voltage generator 700 includes block offset memory 702, location offset memory 704, and voltage generator 708 that are interconnected and operate in the same manner as block offset memory 602, location offset memory 604, and voltage generator 608, respectively, of FIG. 6. Source voltage generator 700 also includes data pattern offset memory 706. Data pattern offset memory 706 may be nonvolatile memory such as flash memory cells, EPROM cells, ROM cells, or EEPROM cells, or other types of memory including volatile memory.

In response to a data value received from data pattern monitor 509 via bus 528, data pattern offset memory outputs on bus 714 a value corresponding to an offset voltage corresponding to the number of selected memory cells that are programmed at one time. For one embodiment, data pattern offset memory 706 stores the values indicating the offset voltages at addresses that are accessed by the data value on bus 528. For another embodiment, data pattern offset memory 706 stores a program that calculates the offset voltage in response to the address received on bus 528.

Voltage generator 708 receives the values from block offset memory 702, location offset memory 704, and data pattern offset memory 706 and generates the source line voltage VPS which compensates for source line resistance between memory blocks, source line resistance within a memory block, and the number of selected memory cells being programmed at one time.

As previously described, the bit line resistance and source line resistance may be simulated or calculated prior to fabrication of memory device 300. For the embodiments of FIGS. 6 and 7, values may then be stored in block offset memories 602 and 702, location offset memories 604 and 704, and data pattern offset memory 706 to generate HHVPW or VPS. For another embodiment, drain voltage generator 308 and source voltage generator 312 may be characterized and adjusted such that HHVPW and VPS adequately compensate for bit line resistance and source line resistance. For one embodiment, block offset memories 602 and 702, location offset memories 604 and 704, and data pattern offset memory 706 are programmable memories that may be updated to store new values based on characterization of the states generated by programming a selected memory cell for a given programming time.

Figure 8:
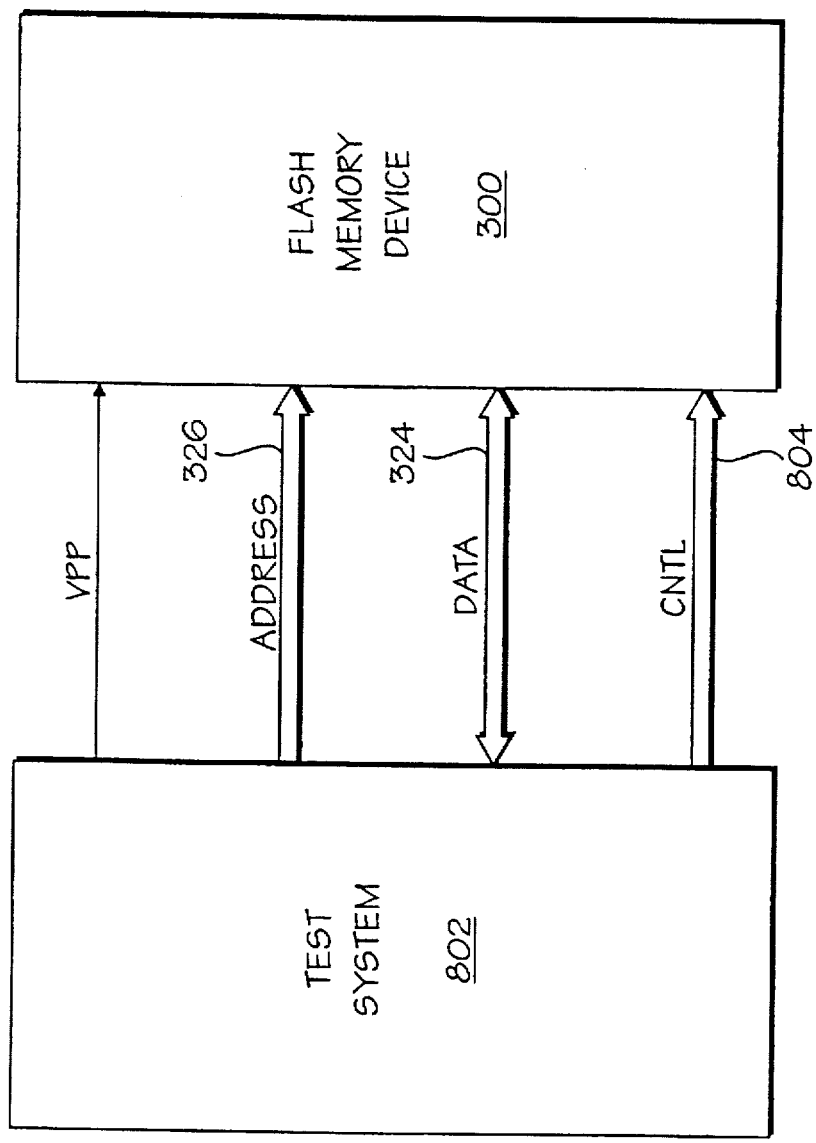
FIG. 8 is a block diagram of the flash memory device of FIG. 3 coupled to a test system.

FIG. 8 illustrates test system 802 coupled to flash memory device 300. For one embodiment, test system 802 is a computer controlled test system that sends appropriate program, erase, and read commands to flash memory device 300 via address bus 326, data bus 324, and control bus 804. Control bus 804 may include control signals OEB, WEB, and CEB, as well as other control signals. Test system 802 may also supply VPP to flash memory device 300.

Test system 802 may control the process of determining if the selected memory cells are being programmed to predetermined states within predetermined programming times. If a selected memory cell is not programmed to a predetermined state within a predetermined programming time, then the bit line voltage may be increased by adjusting HHPVW generated by drain voltage generator 308, the source line voltage may be decreased by adjusting VPS generated by source voltage generator 312, or both HHVPW and VPS may be adjusted. New values may then be stored in either the block offset memory, the location offset memory, or the data pattern offset memory of the drain voltage generator or the source voltage generator corresponding to the new HHVPW or new VPS value. Alternatively, the software routine used by drain voltage generator 308 or source voltage generator 312 to calculate HHPVW or VPS, respectively may be adjusted accordingly.

Figure 9:
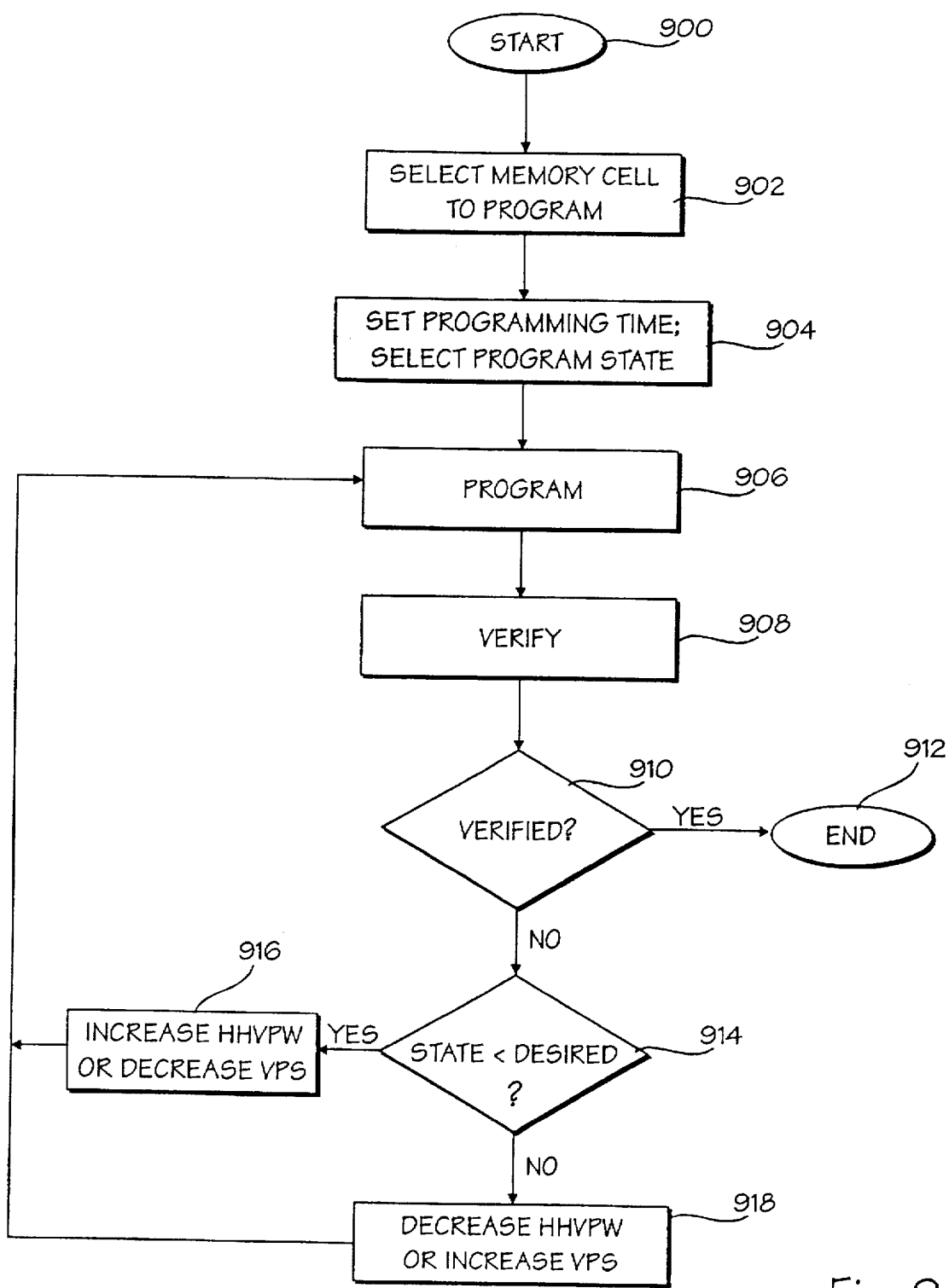
FIG. 9 is a flow chart that shows one embodiment of setting characterizing and adjusting the drain voltage generator and/or the source voltage generator of FIG. 3.

FIG. 9 shows one method that may be implemented by test system 802. The process starts at step 900. At step 902, a memory cell is selected for programming and the address of the selected memory cell is provided to flash memory device 300. At step 904, a programming time is set such that the selected memory cell should be programmed to a predetermined state within the programming time. At step 906, the selected memory cell is programmed for the predetermined programming time. At step 908, the programming is verified by reading out the state to which the selected memory cell was programmed.

If the state read from the selected memory cell is the desired state as determined at step 910, then the process ends at step 912. If the state read from the selected memory cell is not the desired state, then the selected memory cell did not program to the desired state within the predetermined programming time. This will occur if HHVPW and/or VPS does not adequately compensate for the bit line resistance or source line coupled to the selected memory cell.

At step 914, test system 802 determines if the state read from the selected memory cell is less than the desired state indicating that the selected memory cell was not programmed fast enough. If yes, then test system 802 may increase HHVPW and/or decrease VPS by adjusting the values or program stored in drain voltage generator 308 or source voltage generator 312, respectively. The process then returns to step 906 and continues until the selected memory cell is programmed to the desired state in the predetermined programming time.

If test system 802 determines that the state read from the selected memory cell is greater than the desired state, then the selected memory cell has been programmed too quickly and test system 802 may decrease HHVPW and/or increase VPS by adjusting the values or program stored in drain voltage generator 308 or source voltage generator 312, respectively. The process then returns to step 906 and continues until the selected memory cell is programmed to the desired state in the predetermined programming time.

For another embodiment, an external test system 802 is not required and control circuit 304 may perform all of the steps illustrated in FIG. 9 to self-adjust drain voltage generator 308 and/or source voltage generator 312 of flash memory device 300.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A nonvolatile memory device comprising:

a memory array including a bit line, a source line, and a nonvolatile memory cell having a drain coupled to the bit line, a source coupled to the source line, a control gate, and a floating gate; and a source voltage generator circuit coupled to the source line and generating a source line voltage when programming the nonvolatile memory cell, wherein the source voltage generator circuit varies the source line voltage based on a location of the nonvolatile memory cell in the memory array.

2. The nonvolatile memory device of claim 1, wherein the source line has a source line resistance between the source of the nonvolatile memory cell and the source voltage generator circuit, and the source voltage generator circuit varies the source line voltage to compensate for the source line resistance.

3. The nonvolatile memory device of claim 1, further comprising a drain voltage generator circuit coupled to the bit line and generating a bit line voltage when programming the nonvolatile memory cell, wherein the drain voltage generator circuit varies the bit line voltage based on the location of the nonvolatile memory cell in the memory array.

4. The nonvolatile memory device of claim 3, wherein the source line has a source line resistance between the source of the nonvolatile memory cell and the source voltage generator circuit, the bit line has a bit line resistance between a bit line voltage and the drain of the nonvolatile memory cell, the source voltage generator circuit varies the source line voltage to compensate for the source line resistance, and the drain voltage generator circuit varies the bit line voltage to compensate for the bit line resistance.

5. The nonvolatile memory device of claim 3, further comprising a control circuit coupled to the source voltage generator circuit and the drain voltage generator circuit, wherein the control circuit controls programming of the nonvolatile memory cell.

6. The nonvolatile memory device of claim 5, wherein the control circuit decodes an address of the nonvolatile memory cell to generate a first value and a second value, wherein the control circuit couples the first value to the source voltage generator circuit and the source voltage generator circuit generates the source line voltage in response to the first value, and wherein the control circuit couples the second value to the drain voltage generator circuit and the drain voltage generator circuit generates the bit line voltage in response to the second value.

7. The nonvolatile memory device of claim 1, wherein the memory array includes a plurality of bit lines and a plurality of nonvolatile memory cells each having a drain coupled to one of the bit lines, a source coupled to the source line, a control gate, and a floating gate, wherein the source voltage generator circuit further varies the source line voltage based on a number of the plurality of memory cells programmed at one time.

8. The nonvolatile memory device of claim 1, wherein the memory array includes a plurality of nonvolatile memory blocks each including a bit line, wherein the nonvolatile memory cell is included within a selected one of the nonvolatile memory blocks, and wherein the source voltage generator circuit varies the source line voltage based on an address of a selected nonvolatile memory block and a location of the nonvolatile memory cell in the selected nonvolatile memory block.

9. The nonvolatile memory device of claim 8, further comprising a drain voltage generator circuit coupled to the bit line and generating a bit line voltage when programming the nonvolatile memory cell, wherein the drain voltage generator circuit varies the bit line voltage based on the location of the nonvolatile memory cell in the selected nonvolatile memory block.

10. A nonvolatile memory device comprising:

a memory array including a bit line, a source line, and a nonvolatile memory cell having a drain coupled to the bit line, a source coupled to the source line, a control gate, and a floating gate; and a drain voltage generator circuit coupled to the bit line and generating a bit line voltage when programming the nonvolatile memory cell, wherein the drain voltage generator circuit varies the bit line voltage based on the location of the nonvolatile memory cell in the memory array.

11. The nonvolatile memory device of claim 10, wherein the source line has a source line resistance between the source of the nonvolatile memory cell and a source line generator voltage, the bit line has a bit line resistance between a bit line voltage source and the drain of the nonvolatile memory cell, and the drain voltage generator circuit varies the bit line voltage to compensate for the source line resistance and the bit line resistance.

12. A nonvolatile memory device comprising:

a memory array including a plurality of bit lines, a source line, and a plurality of nonvolatile memory cells each having a drain coupled to one of the bit lines, a source coupled to the source line, a control gate, and a floating gate; and a source voltage generator circuit coupled to the source line and generating a source line voltage when programming one of the nonvolatile memory cells, wherein the source voltage generator circuit varies the source line voltage based on the number of nonvolatile memory cells programmed at one time.

13. A nonvolatile memory device comprising:

a memory array including a plurality of bit lines, a source line, and a plurality of nonvolatile memory cells each having a drain coupled to one of the bit lines, a source coupled to the source line, a control gate, and a floating gate; and a drain voltage generator circuit coupled to the bit line and generating a bit line voltage when programming one of the nonvolatile memory cells, wherein the drain voltage generator circuit varies the bit line voltage based on the number of nonvolatile memory cells programmed at one time.

14. A method for setting a source line voltage for a selected one of a plurality of nonvolatile memory cells, wherein the plurality of nonvolatile memory cells each have a drain coupled to a bit line having a bit line resistance and a source coupled to the source line having a source line resistance, the method comprising the steps of:

decoding an address of the selected nonvolatile memory cell to produce a decoded address; and adjusting, in response to the decoded address, the source line voltage coupled to the source line to compensate for the bit line resistance and the source line resistance.

15. The method of claim 14, further comprising the step of determining a number of the nonvolatile memory cells to be programmed together with the selected nonvolatile memory cell, wherein the adjusting step further adjusts the source line voltage of the selected nonvolatile memory cell in response to the number of nonvolatile memory cells programmed together with the selected nonvolatile memory cell.

16. A method for setting a bit line voltage for a selected one of a plurality of nonvolatile memory cells, wherein the plurality of nonvolatile memory cells each have a drain coupled to a bit line having a bit line resistance and a source coupled to the source line having a source line resistance, the method comprising the steps of:

decoding an address of the selected nonvolatile memory cell to produce a decoded address; and adjusting, in response to the decoded address, the bit line voltage of the bit line coupled to the selected memory cell to compensate for the bit line resistance and the source line resistance.

17. A method for setting a source line voltage and a bit line voltage for a selected one of a plurality of nonvolatile memory cells, wherein the plurality of nonvolatile memory cells each have a drain coupled to a bit line having a bit line resistance and a source coupled to the source line having a source line resistance, the method comprising the steps of:

decoding an address of the selected nonvolatile memory cell to produce a decoded address;

adjusting, in response to the decoded address, the source line voltage coupled to source line to compensate for the source line resistance; and adjusting, in response to the decoded address, the bit line voltage for the bit line couple to the selected nonvolatile memory cell to compensate for the bit line resistance.

18. The method of claim 17, further comprising the step of determining a number of the nonvolatile memory cells to be programmed together with the selected nonvolatile memory cell, wherein the step of adjusting the source line voltage further adjusts the source line voltage of the selected nonvolatile memory cell in response to the number of nonvolatile memory cells programmed together with the selected nonvolatile memory cell.

19. The nonvolatile memory device of claim 2, wherein the bit line has a bit line resistance and the source voltage generator varies the source line voltage to compensate for the bit line resistance.

20. The nonvolatile memory device of claim 19, further comprising a bit line voltage source coupled to the bit line, wherein the bit line resistance is between the bit line voltage source and the drain of the nonvolatile memory cell.

\* \* \* \* \*